United States Patent
Yang et al.

(10) Patent No.: US 12,080,560 B2
(45) Date of Patent: Sep. 3, 2024

(54) METHODS FOR FORMING DIELECTRIC LAYER IN FORMING SEMICONDUCTOR DEVICE

(71) Applicant: YANGTZE MEMORY TECHNOLOGIES CO., LTD., Wuhan (CN)

(72) Inventors: Yonggang Yang, Wuhan (CN); Xiaohong Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 306 days.

(21) Appl. No.: 17/498,337

(22) Filed: Oct. 11, 2021

(65) Prior Publication Data
US 2023/0069697 A1 Mar. 2, 2023

Related U.S. Application Data

(63) Continuation of application No. PCT/CN2021/115993, filed on Sep. 1, 2021.

(51) Int. Cl.
*H01L 21/311* (2006.01)
*H01L 21/3105* (2006.01)

(52) U.S. Cl.
CPC .. *H01L 21/31144* (2013.01); *H01L 21/31053* (2013.01); *H01L 21/31116* (2013.01)

(58) Field of Classification Search
CPC ......... H01L 21/31144; H01L 21/31053; H01L 21/31116; H01L 21/31055; H10B 41/27; H10B 41/50; H10B 43/27; H10B 43/50
See application file for complete search history.

(56) References Cited

U.S. PATENT DOCUMENTS

| | | | |
|---|---|---|---|
| 6,117,798 A | 9/2000 | Fang et al. | |
| 9,768,024 B1* | 9/2017 | Tsai | H01L 21/31053 |
| 10,916,554 B2* | 2/2021 | Shin | H10B 43/10 |

(Continued)

FOREIGN PATENT DOCUMENTS

| CN | 105719964 A | | 6/2016 |
|---|---|---|---|
| CN | 107564916 A | * | 1/2018 |

(Continued)

OTHER PUBLICATIONS

Zhang et al, CN-107564916-A, Machine Translation, whole doc. (Year: 2023).*

(Continued)

*Primary Examiner* — Duy Vu N Deo
*Assistant Examiner* — Christopher Remavege
(74) *Attorney, Agent, or Firm* — BAYES PLLC

(57) ABSTRACT

Methods for forming a 3D memory device are provided. A method includes the following operations. A stack structure is formed in a staircase region and an array region. A dielectric material layer is formed over the array region and the staircase region. An etch mask layer is coated over the dielectric material layer. The etch mask layer, on a first surface away from the dielectric material layer, is planarized. The dielectric material layer and a remaining portion of the etch mask layer are etched to form a dielectric layer over the staircase region and the array region.

20 Claims, 8 Drawing Sheets

(56) References Cited

U.S. PATENT DOCUMENTS

| | | | |
|---|---|---|---|
| 2008/0048340 A1* | 2/2008 | Lee | H01L 21/0338 |
| | | | 257/E21.038 |
| 2012/0070944 A1* | 3/2012 | Kim | H10B 43/20 |
| | | | 257/E21.614 |
| 2013/0334591 A1* | 12/2013 | Matsuda | H01L 29/66833 |
| | | | 257/324 |
| 2018/0166454 A1* | 6/2018 | Pyon | H10B 41/20 |
| 2019/0157097 A1* | 5/2019 | Chang | H01L 21/02118 |
| 2019/0206727 A1* | 7/2019 | Matovu | H01L 23/5226 |
| 2020/0006378 A1* | 1/2020 | Huo | H10B 43/50 |
| 2021/0091303 A1* | 3/2021 | Patlolla | H10N 50/85 |
| 2021/0159149 A1* | 5/2021 | Kitazawa | H10B 43/10 |
| 2021/0351196 A1* | 11/2021 | Cheng | H10B 43/40 |
| 2021/0384124 A1* | 12/2021 | Wang | H01L 21/76816 |
| 2022/0199416 A1* | 6/2022 | Zhou | H01L 21/31053 |

FOREIGN PATENT DOCUMENTS

| | | |
|---|---|---|
| CN | 109065545 A | 12/2018 |
| CN | 109817521 A | 5/2019 |
| TW | 325581 B | 1/1998 |
| TW | 202044343 A | 12/2020 |

OTHER PUBLICATIONS

International Search Report issued in corresponding International Application No. PCT/CN2021/115993, mailed Jun. 1, 2022, 4 pages.

* cited by examiner

US 12,080,560 B2

METHODS FOR FORMING DIELECTRIC LAYER IN FORMING SEMICONDUCTOR DEVICE

CROSS-REFERENCE TO RELATED APPLICATIONS

This application is continuation of International Application No. PCT/CN2021/115993, filed on Sep. 1, 2021, entitled "METHODS FOR FORMING DIELECTRIC LAYER IN FORMING SEMICONDUCTOR DEVICE," which is hereby incorporated by reference in its entirety.

BACKGROUND

The present disclosure relates to semiconductor fabrication methods.

In the formation of semiconductor devices, etching and polishing processes are often used for reducing the thickness of materials. Etching refers to any process that can remove material from a wafer. Chemical mechanical polishing (CMP, a.k.a. chemical mechanical planarization) is a process of smoothing wafer surface with the combination of chemical etching and free abrasive mechanical polishing. To planarize material with an uneven surface, etching and polishing processes can be combined to produce material of a desired thickness.

SUMMARY

In one aspect, a method for forming a three-dimensional (3D) memory device is provided. The method includes forming a stack structure in a staircase region and an array region, forming a dielectric material layer over the array region and the staircase region, coating an etch mask layer over the dielectric material layer, polishing the etch mask layer on a first surface away from the dielectric material layer, and etching the dielectric material layer and a remaining portion of the etch mask layer to form a dielectric layer over the staircase region and the array region.

In another aspect, a method for forming a 3D memory device is provided. The method includes forming a stack structure in a staircase region and an array region, forming a dielectric material layer over the array region and the staircase region, forming an etch mask portion over a portion of the dielectric material layer over the staircase region, and etching the dielectric material layer and the etch mask portion to form a dielectric layer over the staircase region and the array region.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

Figure 1:
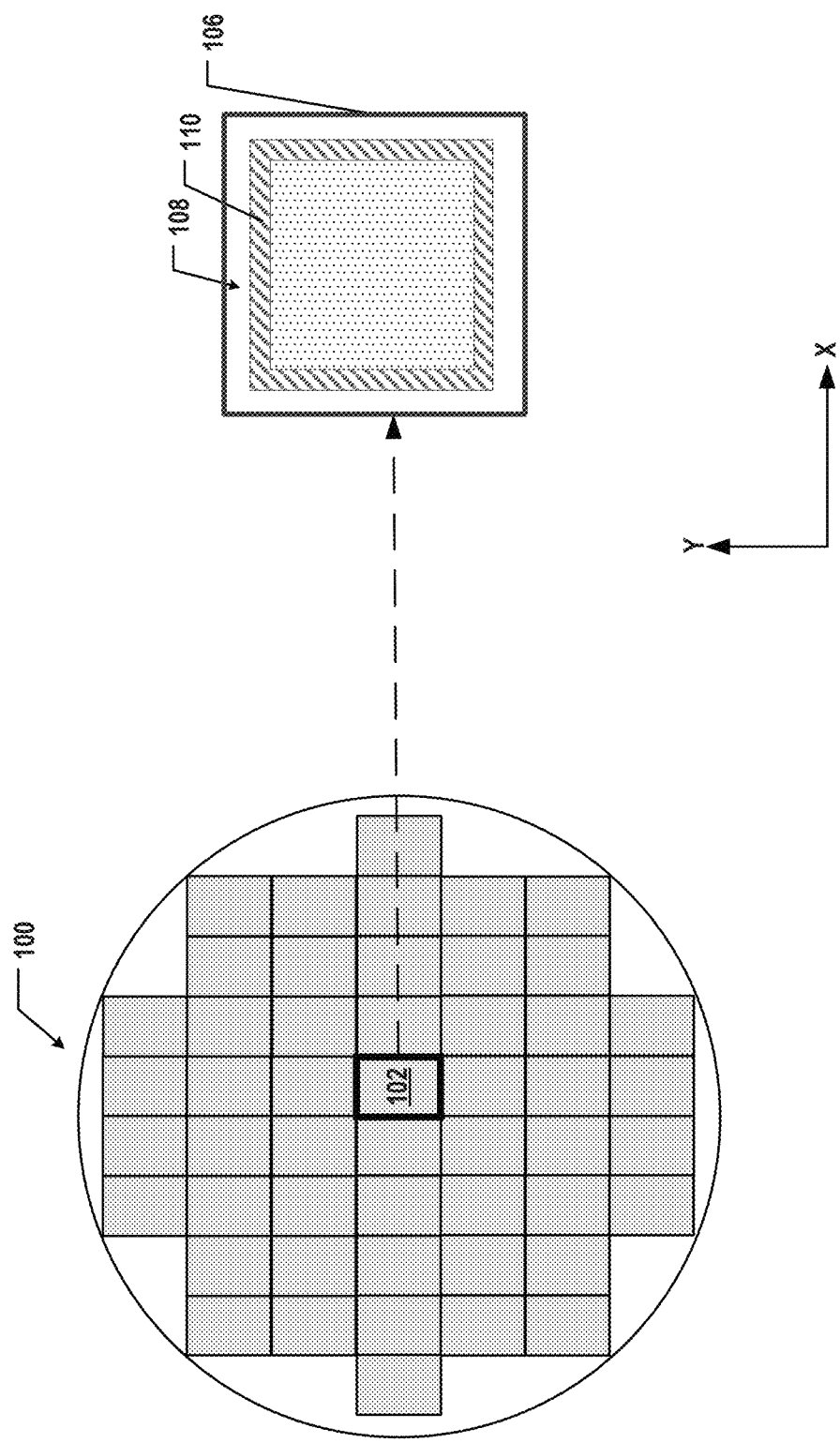
FIG. 1 illustrates a plan view of an exemplary wafer having a plurality of 3D memory device chips, according to some aspects of the present disclosure.

Aspects of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface (e.g., a first surface) and a bottom surface (e.g., a second surface) of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

In fabricating 3D memory devices, such as 3D NAND memory devices, etching and polishing processes are often combined to reduce the thickness of a layer. Sometimes, the layer, before the thickness reduction, can be overly thick. The thinning and planarization of the layer can be difficult to control and costly due to the thickness and undesirably long time it requires to remove a portion of the layer. Specifically, the thinning and planarization of a dielectric material layer formed over a staircase structure of a 3D NAND memory device can have these issues as the number of levels in the 3D NAND memory device increases.

FIG. 1 illustrates a plan view of an exemplary wafer 100 having a plurality of dies 102, according to some aspects of the present disclosure. Dies 102 may be separated by scribe lines 106. As shown in FIG. 1, die 102 can include a stack structure 108, such as a memory stack having interleaved conductive layers (e.g., gate lines/word lines) and dielectric layers (e.g., gate-to-gate dielectrics), which is elevated from the surrounding down area. Each conductive/dielectric layer pair is at a different elevation and is referred to as one level/stair. In some implementations, stack structure 108 includes a staircase structure 110 on one or more sides of stack structure 108. Staircase structure 110 can have a sloped profile elevating from the surrounding down area outside stack structure 108 to the inner area within stack structure 108. Based on the different elevations of the structures therein, die 102 can be separated into three regions: an array region (dot pattern fill) and a staircase region (diagonal pattern fill). In various implementations, a peripheral region (no fill) may or may not be included in die 102. As shown in FIG. 1, in some implementations, stack structure 108 is in both the array region and the staircase region, and staircase structure 110 of stack structure 108 is in the staircase region on the side(s) of stack structure 108. Memory cell arrays, formed by the intersection of conductive layers and channel structures, can be formed in the array region, for example, in the form of arrays of NAND memory strings each extending vertically through stack structures 108. Memory cell arrays may be employed to store data. For example, scribe lines 106 may be between dies 102. Other protection, testing, or measurement structures, such as seal rings, testing pads, alignment marks, etc., can be in the peripheral region as well.

Figure 2A:
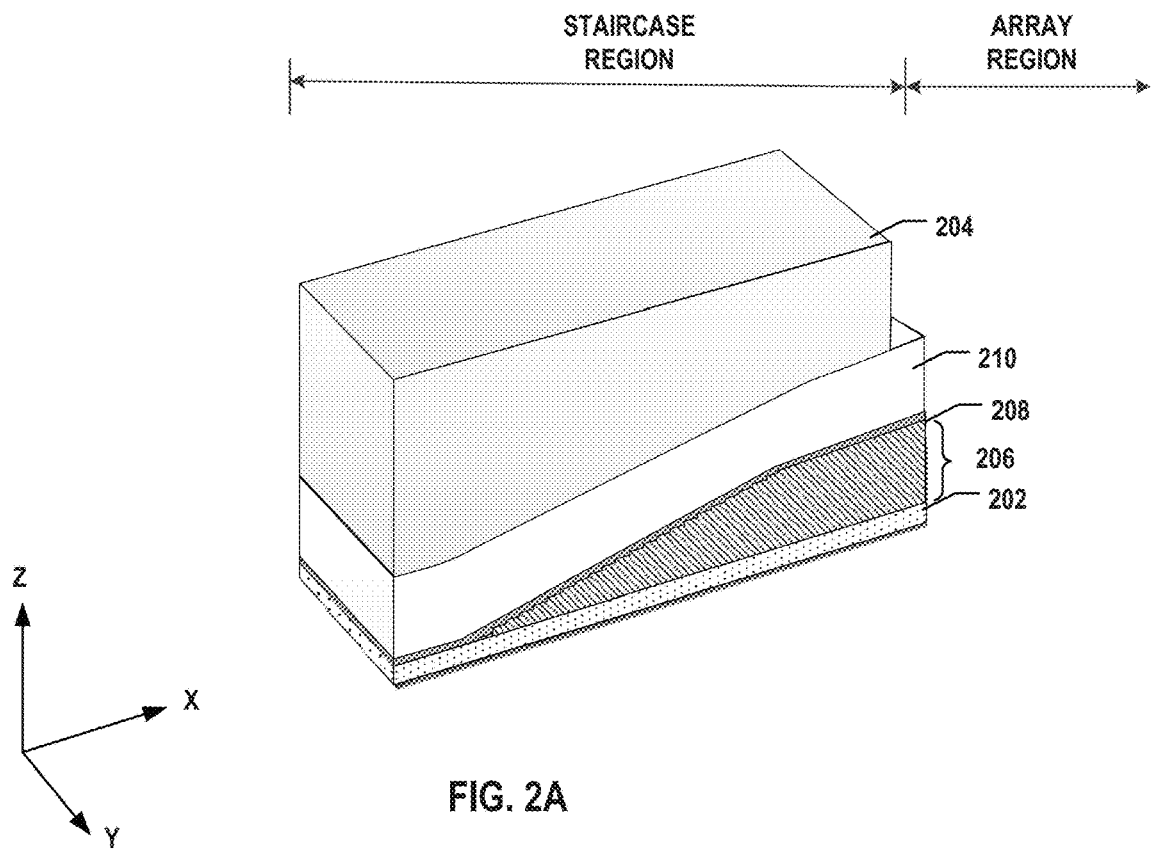
FIGS. 2A-2C illustrate a fabrication process for forming a 3D memory device.
Figure 2B:
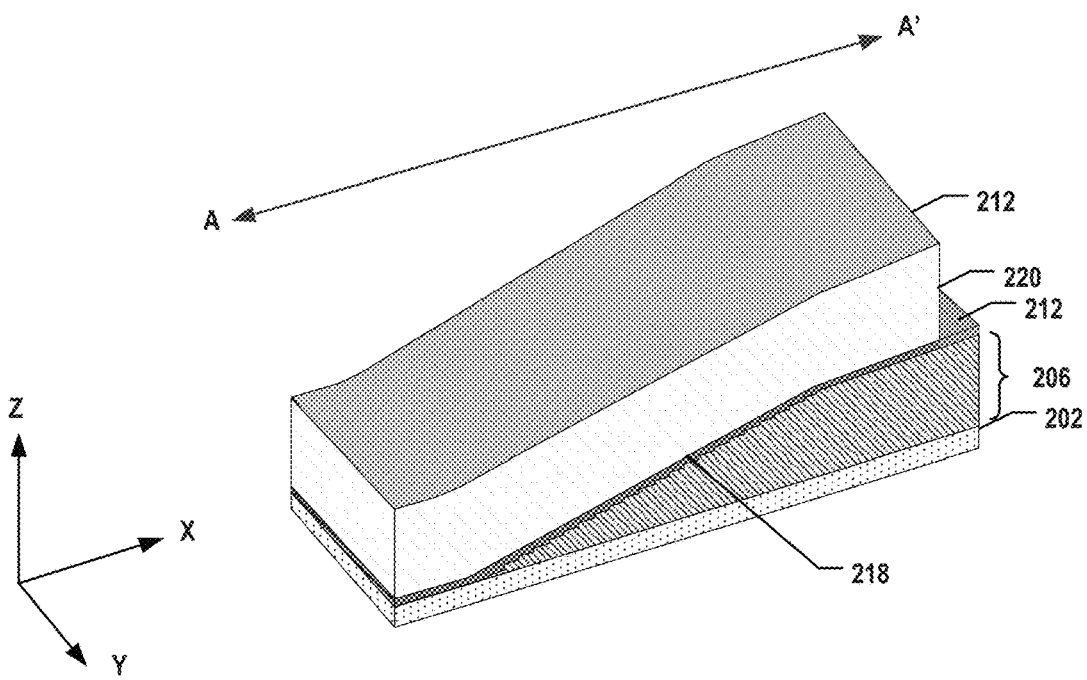
Figure 2C:
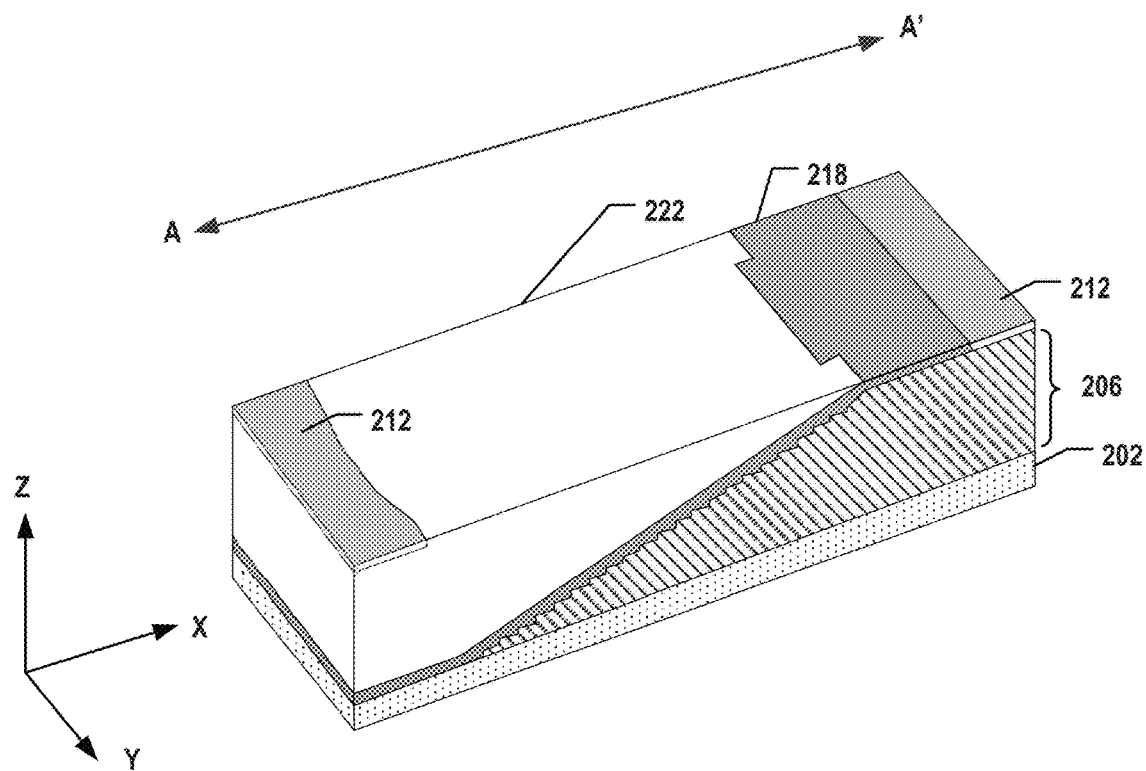
Figure 2D:
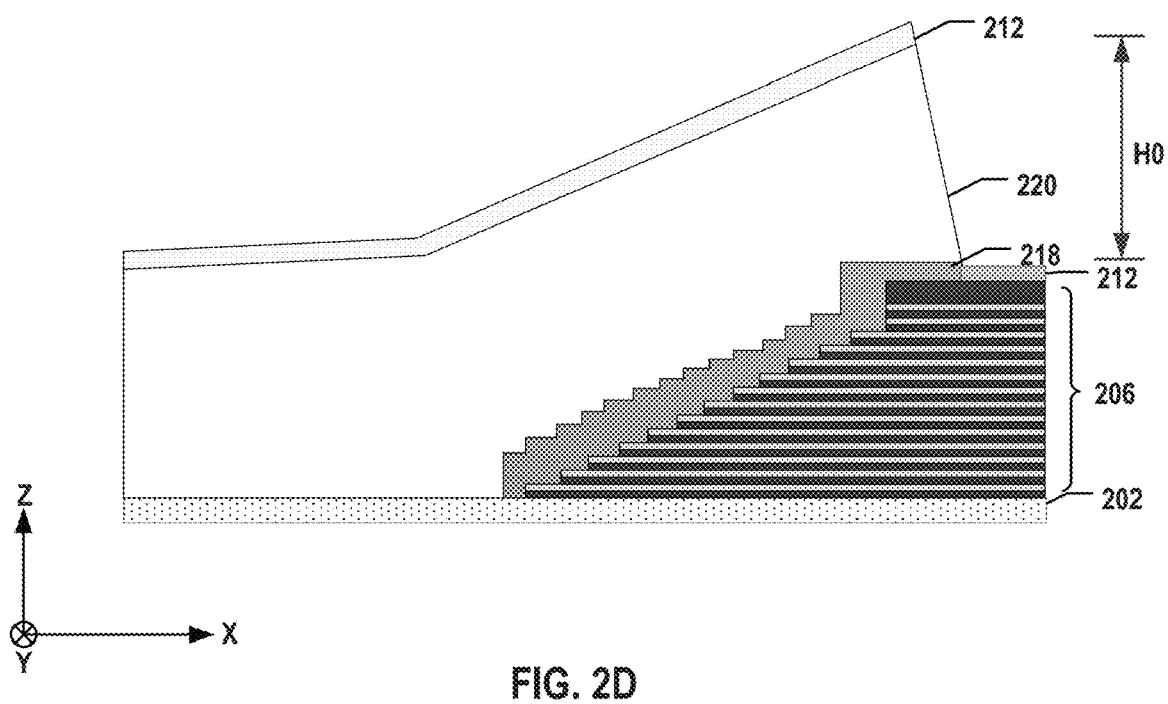
FIGS. 2D and 2E each illustrates a cross-sectional view of the 3D memory device at a different fabrication stage.
Figure 2E:
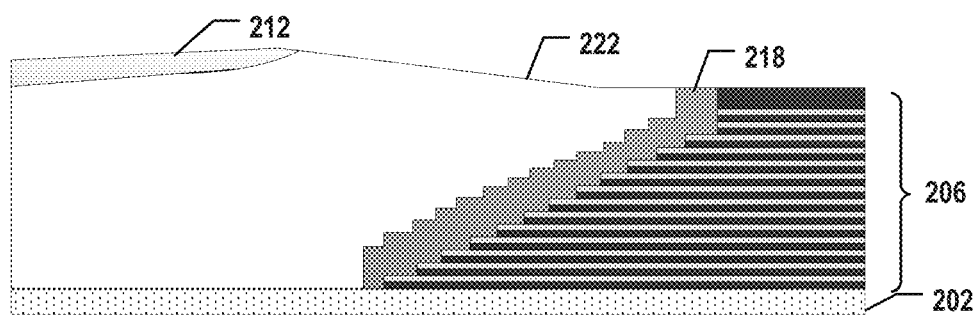
Figure 2E:
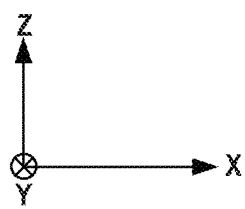

FIGS. 2A-2C illustrate an exemplary fabrication process for forming a 3D memory device in a fabrication process. Specifically, the etching and polishing processes for the formation of a dielectric layer over a staircase structure of 3D memory device are shown. FIG. 2D illustrates a cross-sectional view of part of 3D memory device shown in FIG. 2B along an A-A' direction (e.g., along the x-z plane). FIG. 2E a cross-sectional view of part of 3D memory device shown in FIG. 2C along the A-A' direction.

As shown in FIG. 2A, to form a 3D memory device, a stack structure 206 is formed over a substrate 202. Stack structure 206 includes a plurality of conductive layers and a plurality of dielectric layers interleaved in a vertical direction (e.g., the z-direction). Stack structure 206 is partially located in an array region and partially located in a staircase region. Memory cell arrays can be formed in the array region, for example, in the form of arrays of NAND memory strings each extending vertically through stack structures 206. A staircase structure of stack structure 206, having a plurality of stairs, is located in the staircase region, as mentioned above. Contact vias can be formed in contact with the stairs in the staircase region, connecting conductive layers (e.g., word lines) with a peripheral circuit, referring back to FIG. 1 and related description. A protective material layer 208 is formed to cover at least the staircase structure. A dielectric material layer 210 is formed over stack structure 206 (e.g., and protective material layer 208) in the array region and the staircase region. A photoresist layer is formed over dielectric material layer 210 in the array region and the staircase region.

As shown in FIG. 2A, the photoresist layer is first patterned. A patterned photoresist layer 204 covers a portion of dielectric material layer 210 in the staircase region and exposes a portion of dielectric material layer 210 in the array region. As shown in FIG. 2B, dielectric material layer 210 is etched, using patterned photoresist layer 204 as the etch mask, to remove the portion of dielectric material layer 210 and protective material layer 208 in the array region. A protective layer 218 (formed from the patterning of protective material layer 208) and a patterned dielectric material layer 220 (formed from the patterning of dielectric material layer 210) are formed over the staircase structure. Patterned photoresist layer 204 is then removed. An etch stop layer 212 is formed covering the exposed portion of stack structure 206 and patterned dielectric material layer 220. As shown in FIG. 2C, patterned dielectric material layer 220 then undergoes a polishing process to remove any excessive portion above stack structure 206. The polishing of patterned dielectric material layer 220 then stops on the etch stop layer 212, when the amount of dielectric material is removed from the top of stack structure 206 Pattern dielectric material layer 220 is then planarized, forming a dielectric layer 222 over the staircase structure.

As shown in FIG. 2D, patterned dielectric material layer 220, before the polishing process, can have a step over stack structure 206. The step, having a thickness (or step height) of H0, is formed by the differences in etch depths between the array region and staircase region of dielectric material layer 210. For a 3D memory device with an increasing number of levels (e.g., the increasing number of conductive/dielectric layer pairs or stairs), the height of the staircase structure increases accordingly. H0 can become undesirably large, caused by the increasing amount of dielectric material deposited to cover the staircase structure. For example, for a staircase structure of about 200 levels, H0 can reach about 10 μm. The polishing of patterned dielectric material layer 220 in the z-direction can take an undesirably long time, making the fabrication process costly. Meanwhile, the polishing process is stopped by etch stop layer 212. Due to the long polishing process, patterned dielectric material layer 220 can be susceptible to over etch/polishing, causing void, scratch, or other defects on the polished surface of the formed dielectric layer 222. As shown in FIG. 2E, the formed dielectric layer 222 can have an uneven polished surface. As a result, other structures formed over dielectric layer 222 are also susceptible to uneven surfaces, causing various potential issues, such as misalignment and over/under etch, in the subsequent fabrication process.

To address one or more of the aforementioned issues, the present disclosure introduces a solution to form a dielectric layer with improved surface evenness. According to the methods of the present disclosure, a photoresist layer is polished, instead of patterned, in both the array region and staircase region. The polishing of the photoresist layer can stop when the underneath dielectric material layer is exposed in the array region. The remaining photoresist portion in the staircase region and the exposed portion of the dielectric material layer in the array region may undergo the same etching process, which has a higher etch rate on the dielectric material layer than the remaining photoresist portion. The etching may remove a larger amount of the dielectric material in the array region than in the staircase region, due to the blocking effect of the remaining photoresist portion. After the dielectric material layer is etched to a desired thickness in the array region, the remaining photoresist portion is removed. The dielectric material layer is then polished to form a dielectric layer over the staircase structure.

By polishing, instead of etching, the photoresist layer, the formed remaining photoresist portion in the staircase structure can provide protection (e.g., blocking effect) of the underneath dielectric material layer during the etching of the dielectric material in the array region. When the dielectric material layer is being etched, the remaining photoresist portion, having a lower etch rate than that of the dielectric material, can reduce the differences in etch depths between the array region and the staircase region of the dielectric material layer. The step height of the dielectric material can be reduced. The reduced step height can effectively reduce the time and cost of the polishing process, thereby allowing the polishing process to be controlled more easily. The formed dielectric layer can have improved evenness on the polished surface, providing an improved base surface for subsequent processes.

Although the methods of the present disclosure are illustrated in view of a 3D memory device, consistent with the scope of the present disclosure, the methods disclosed herein can also be applied for the thinning and planarization of any suitable film having a step, e.g., with an undesirably large step height, between adjacent surfaces of different elevations/slopes. The methods can be applied to form any suitable semiconductor devices including but not limited to, logic devices (e.g., central processing unit (CPU), graphics processing unit (GPU), and application processor (AP)), volatile memory devices (e.g., dynamic random-access memory (DRAM) and static random-access memory (SRAM)), non-volatile memory devices (e.g., NAND Flash memory, NOR Flash memory), or any combinations thereof in a 2D, 2.5D, or 3D architecture.

Figure 3A:
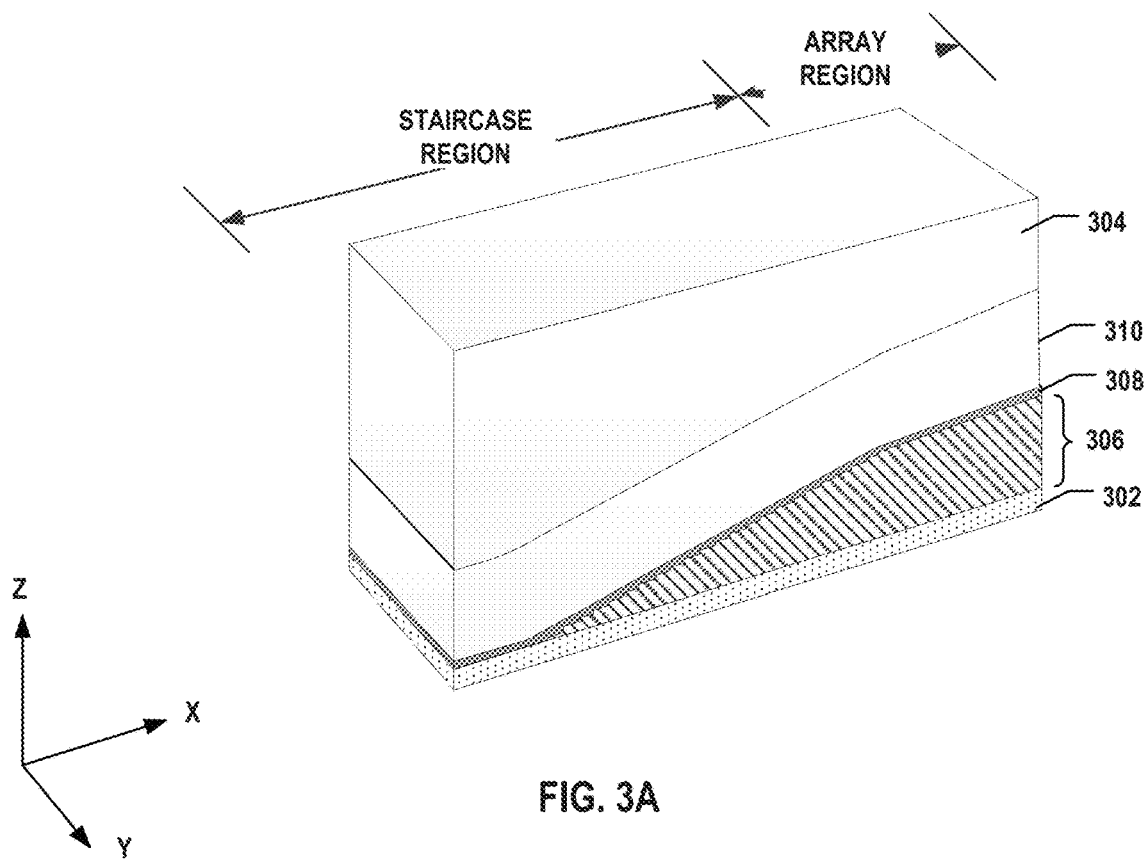
FIGS. 3A-3C illustrate an exemplary fabrication process for forming a 3D memory device, according to some aspects of the present disclosure.
Figure 3B:
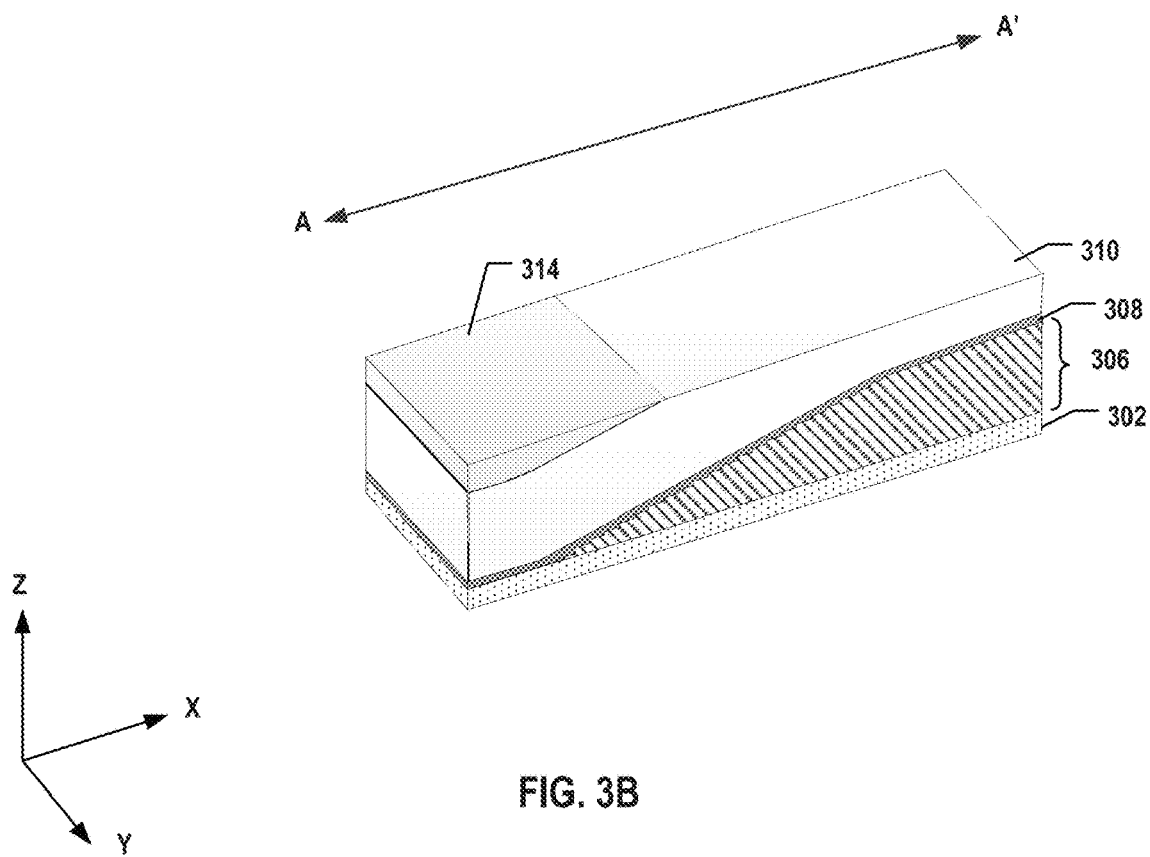
Figure 3C:
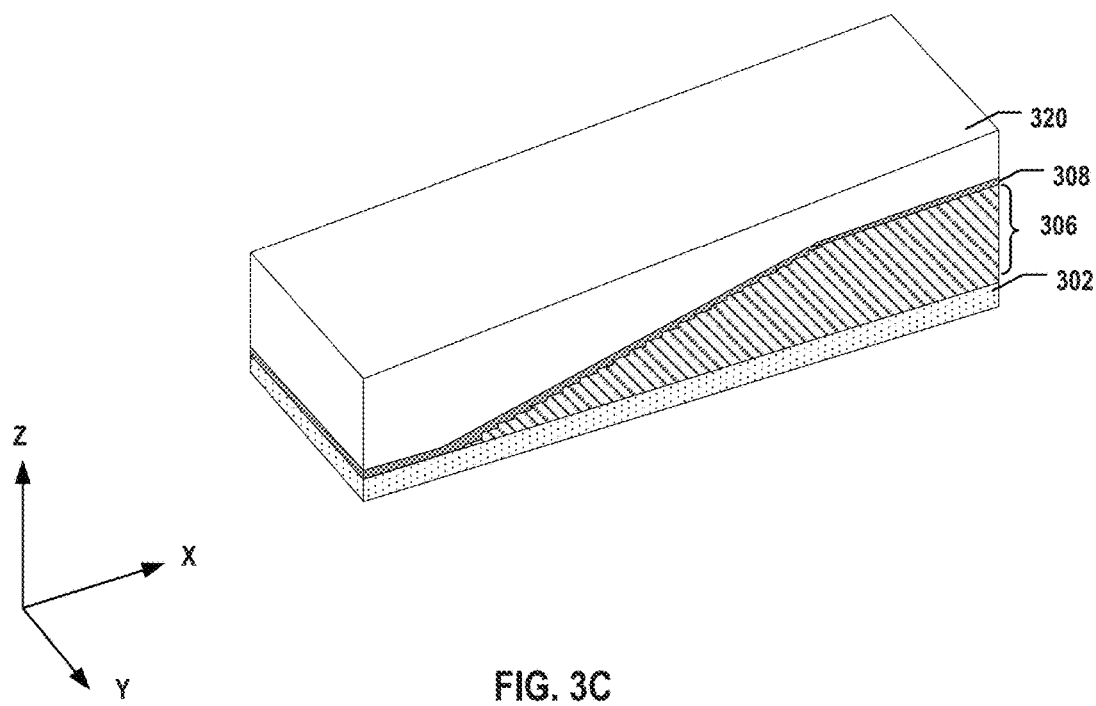
Figure 3D:
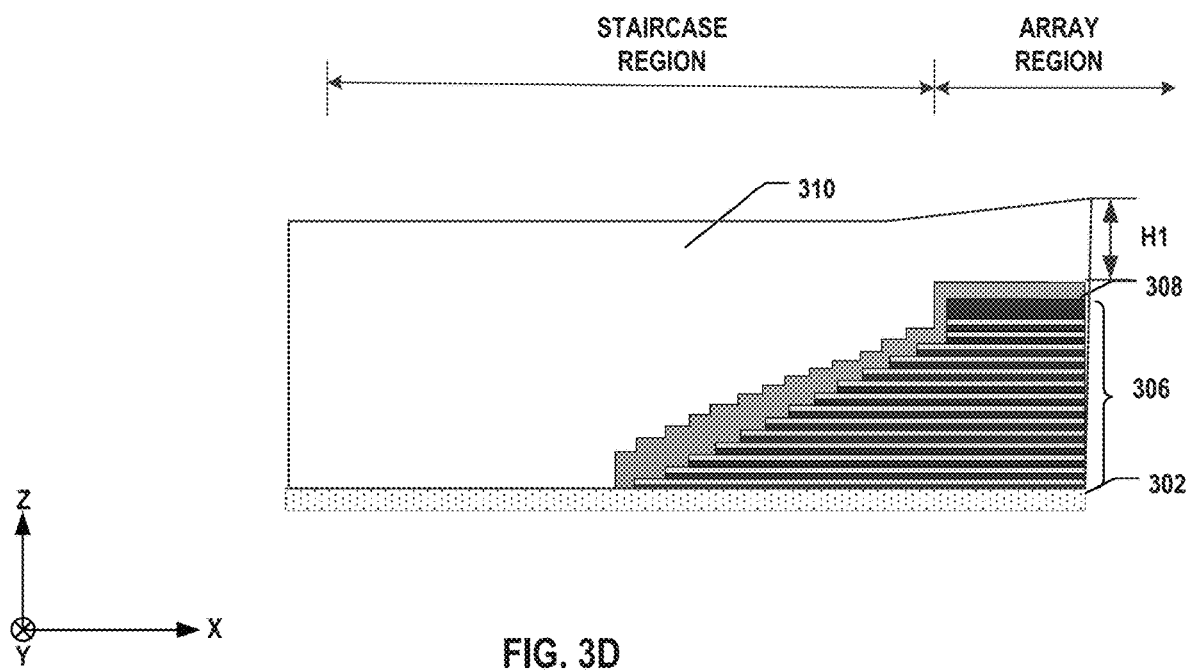
FIG. 3D illustrates a cross-sectional view of the 3D memory device at a fabrication stage, according to some aspects of the present disclosure.
Figure 4:
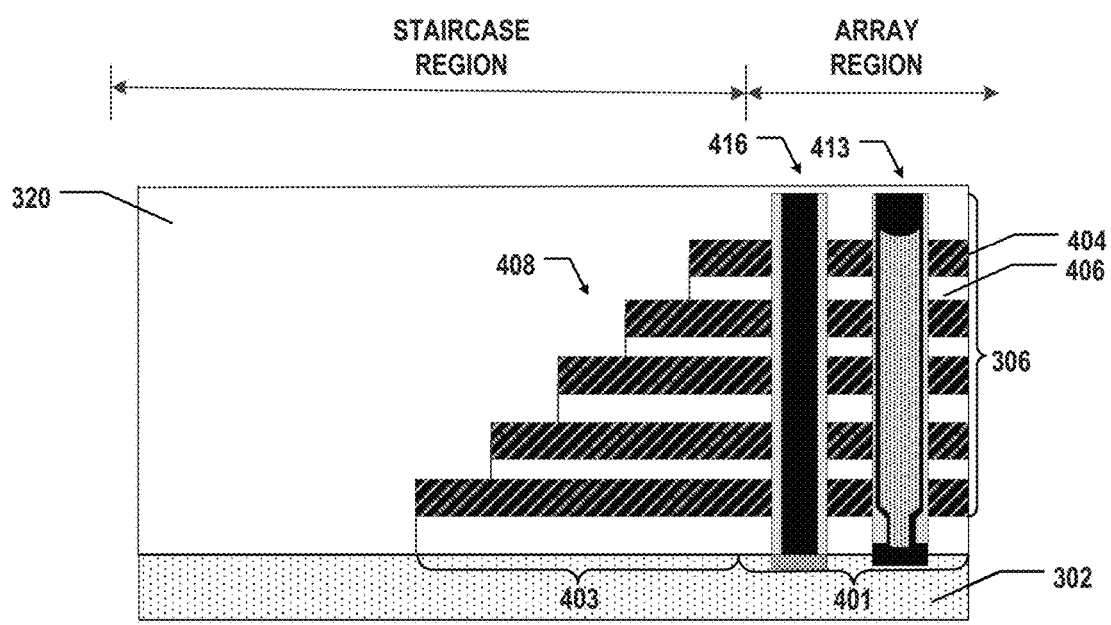
FIG. 4 illustrates an exemplary 3D memory device, according to some aspects of the present disclosure.
Figure 5:
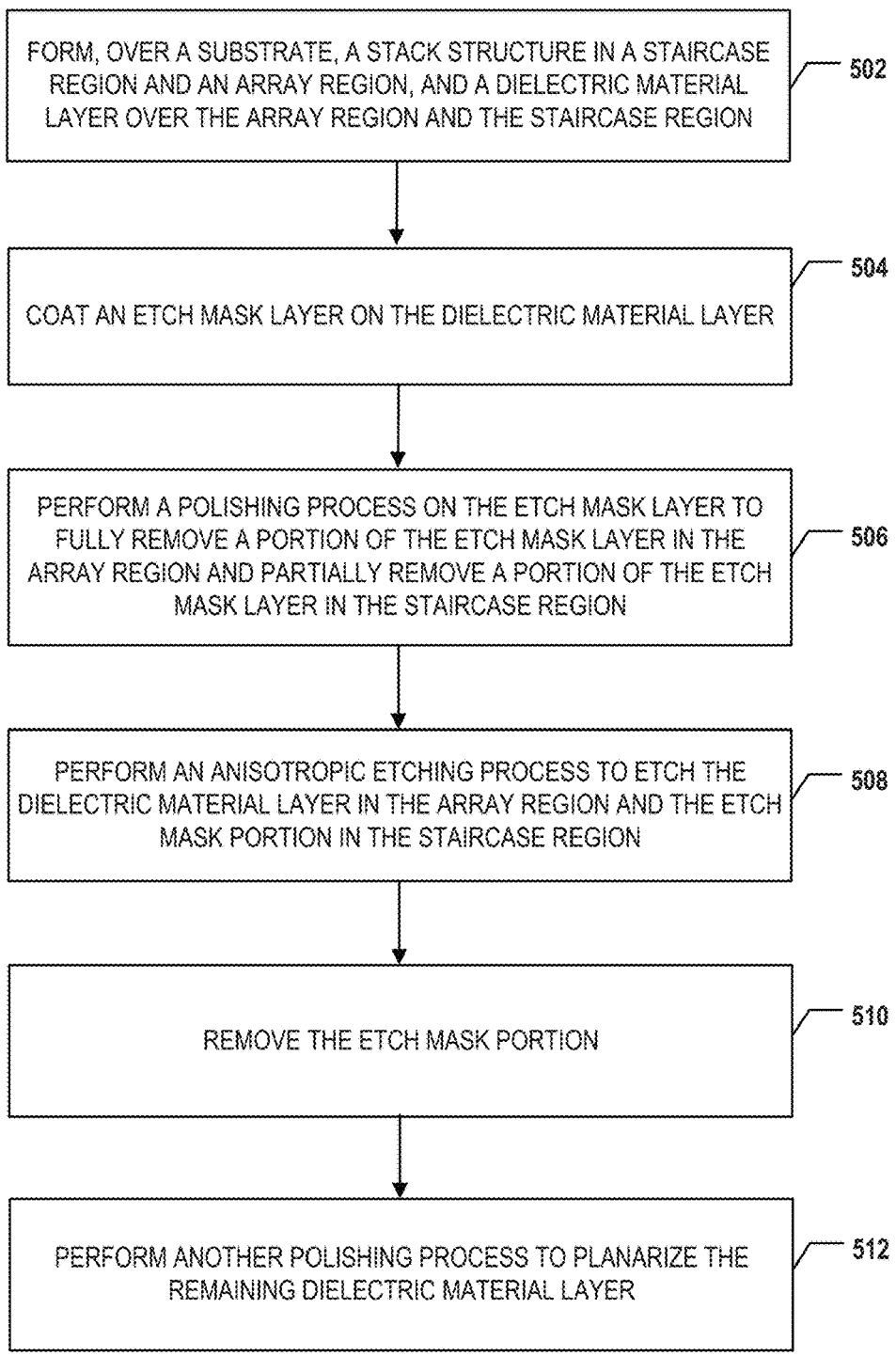
FIG. 5 is a flowchart of an exemplary method for forming a 3D memory device, according to some aspects of the present disclosure.

FIGS. 3A-3C illustrate an exemplary fabrication process for forming part of a 3D memory device, according to some aspects of the present disclosure. For illustrative simplicity, FIGS. 3A-3C and 4 only depict the formation of a stack structure in the 3D memory device, according to some implementations. FIG. 3D illustrates a cross-sectional view of the 3D memory device at a fabrication stage shown in FIG. 3B, according to some aspects of the present disclosure. FIG. 4 illustrates a cross-sectional view of the 3D memory device, according to some aspects of the present disclosure. FIG. 5 is a flowchart of an exemplary method 500 for forming a 3D memory device, according to some aspects of the present disclosure. FIGS. 3A-3D and 5 will be described together. It is understood that the operations shown in method 500 are not exhaustive and that other operations can be performed as well before, after, or between any of the illustrated operations. Further, some of the operations may be performed simultaneously, or in a different order than shown in FIG. 5.

Referring to FIG. 5, method 500 starts at operation 502, in which a stack structure is formed in a staircase region and an array region, and a dielectric material layer is formed over the stack structure. FIG. 3A illustrates a corresponding structure.

As shown in FIG. 3A, a stack structure 306 may be formed over a substrate 302. Stack structure 306 may be over a staircase region and an array region. In some implementations, a staircase structure of stack structure 306 is formed in staircase region, and a plurality of memory cells are formed in the array region. A dielectric material layer 310 may be formed over stack structure 306 in the staircase region and the array region. In some implementations, a protective material layer 308 is formed over stack structure 306, between stack structure 306 and dielectric material layer 310.

It is noted that x, y, and z axes are included in FIGS. 3A-3D and 4 to help illustrate the spatial relationship of the components in the 3D memory device. For example, x and y axes are included in FIGS. 3A-3D to illustrate two perpendicular lateral directions in the wafer plane: the x-direction is the word line direction of the 3D memory device, and the y-direction is the bit line direction of 3D memory device. Referring to FIG. 4, the word line direction (e.g., the x-direction) represents a lateral direction conductive layers 404 extend, and the bit line direction (the y-direction) represents the lateral direction the bit lines (not shown) extend. The x-direction and the y-direction are perpendicular to each other. Substrate 302 of the 3D memory device includes two lateral surfaces extending laterally in the x-y plane: a first surface on the front side of the wafer on which the 3D memory device can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of the 3D memory device is determined relative to substrate 302 of the 3D memory device in the z-direction (the vertical direction perpendicular to the x-y plane) when substrate 302 is positioned in the lowest plane of the 3D memory device in the z-direction. The same notion for describing the spatial relationships is applied throughout the present disclosure.

Substrate 302 can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 302 is a thinned substrate (e.g., a semiconductor layer), which was thinned by grinding, etching, chemical mechanical polishing (CMP), or any combination thereof. In some embodiments, substrate 302 includes silicon.

Stack structure 306 can include a plurality of interleaved conductive layers and dielectric layers (conductive layers 404 and dielectric layers 406 in FIG. 4), interleaved vertically above substrate 302. The conductive layers can include conductive materials including, but not limited to, tungsten (W), cobalt (Co), copper (Cu), aluminum (Al), polycrystalline silicon (polysilicon), doped silicon, silicides, or any combination thereof. The dielectric layers can include dielectric materials including, but not limited to, silicon oxide, silicon nitride, silicon oxynitride, high dielectric constant (high-k) dielectrics, or any combination thereof. The interleaved conductive layers and dielectric layers can be formed from a plurality of interleaved first material layers and second material layers (not shown), interleaved vertically above substrate 302. The first material layers and the second material layers can be alternatingly deposited above substrate 302 to form stack structure 306 using one or more thin film deposition processes including, but not limited to, chemical vapor deposition (CVD), physical vapor deposition (PVD), atomic layer deposition (ALD), or any combination thereof.

Edges of the interleaved first material layers and second material layers can define a staircase structure on a side of the stack structure in the staircase region. In some implementations, first material layers include first dielectric layers, and second material layers (a.k.a. sacrificial layers) include second dielectric layers different from the first dielectric layers. For example, the first material layers may include silicon oxide, and the second material layers may include silicon nitride. The conductive layers may be formed by a so-called gate replacement process (e.g., in a gate-last process) in which the second material layers are replaced with conductive layers. For example, the first material layers may include silicon oxide, and the conductive layers may include metals (e.g., W). In some implementations, the first material layers include dielectric layers, and the second material layers include conductive layers. For example, the first material layers may include silicon oxide, and the second material layers may include polysilicon. The second material layers may be the conductive layers (e.g., in a gate-first process).

A staircase structure having a terraced slope-like shape (e.g., as shown in staircase structure 408 in FIG. 4) is formed on one side of stack structure 306 for purposes such as word line fan-out. In other words, the edges of the interleaved first material layers and second material layers can define the staircase structure on the side of stack structure 306. It is understood that in some examples, additionally or alternatively, the staircase structure may be formed in the intermediate (e.g., the center) of stack structure 306. Each stair (a.k.a. level) of the staircase structure can include one or more pairs of the first and second material layers. That is, the height of each stair can be equal to the total thickness of one or more pairs of the first and second material layers.

The staircase structure can be formed by a so-called trim-etch process, which, in each cycle, trims (e.g., etching incrementally and inwardly, often from all directions) a patterned photoresist layer, followed by etching the exposed portions of the interleaved first material layers and second material layers of stack structure 306 using the trimmed photoresist layer as an etch mask to form one stair of the staircase structure. The process can be repeated until all the stairs of the staircase structure are formed.

A plurality of NAND memory strings (e.g., NAND memory string 413 in FIG. 4) may be formed in the array region of stack structure 306. A plurality of memory cell arrays may be formed in the NAND memory strings. In some implementations, the fabrication process to form NAND memory string includes forming a channel hole through stack structure 306 using dry etching/and or wet etching, such as deep reactive ion etch (DRIE), followed by filling the channel hole with a plurality of layers, such as a memory film and a semiconductor channel, using thin film deposition processes. For example, the memory film may be a composite dielectric layer, such as a combination of multiple dielectric layers including, but not limited to, a blocking layer, a storage layer, and a tunneling layer. The memory film and semiconductor channel can be formed by sequentially depositing a plurality of layers, such as a silicon oxide layer, a silicon nitride layer, a silicon oxide layer, and a polysilicon layer using one or more thin film deposition processes including, but not limited to ALD, CVD, PVD, or any combination thereof. The remaining space of the channel hole may be filled with a capping layer by depositing silicon oxide into the channel hole. In some implementations, a channel plug is formed in the top portion of the channel hole, for example, by etching back the semiconductor channel using dry etching and/or wet etching to form a recess and filling the recess with polysilicon using one or more thin film deposition processes including, but not limited to ALD, CVD, PVD, or any combination thereof.

As illustrated in FIG. 3A, the 3D memory device can include the array region and the staircase region laterally neighboring the array region. The array region and the staircase region may be examples of the array region and staircase region in FIG. 1, respectively. In some implementations, other structures/regions may be located between the staircase region and the array region, such as a peripheral region shown in FIG. 1. In some implementations, stack structure 306 is formed in both the array region and the staircase region, and the staircase structure is formed on the side of stack structure 306 in the staircase region. At the fabrication stage in FIG. 3A, the staircase structure can have a terraced slope with a gradually increased height from the peripheral region to the array region.

Protective material layer 308 can include a suitable insulating material that can provide desirable insulation and protection for the staircase structure. In some implementations, the protective material layer includes high-quality dielectric material, such as high-quality silicon oxide and/or high-quality silicon oxynitride. Dielectric material layer 310 can include a suitable insulating material that can provide insulation for the contacts subsequently formed in the dielectric layer. In some implementations, dielectric material layer 310 includes silicon oxide. In some embodiments, an etch stop layer (not shown) is deposited on dielectric material layer 310. The etch stop layer may include a suitable material, e.g., silicon nitride, on which the subsequent polishing process stops. Protective material layer 308, dielectric material layer 310, and the etch stop layer (e.g., if any) can each be formed by one or more thin film deposition processes including, but not limited to, CVD, PVD, ALD, or any combination thereof.

Method 500 proceeds to operation 504, as illustrated in FIG. 5, in which an etch mask layer is coated on the dielectric material layer. FIG. 3A illustrates a corresponding structure.

As shown in FIG. 3A, an etch mask layer 304 may be coated over dielectric material layer 310 in the array region and the staircase region. Etch mask layer 304 may have desirable evenness laterally (in the x-y plane) on a top surface (e.g., a first surface), i.e., the lateral surface away from stack structure 306. Etch mask layer 304 may be forming on stack structure 306 through a spin coating process. Depending on the material, etch mask layer 304 may or may not undergo a curing treatment to increase the stiffness of etch mask layer 304. Etch mask layer 304 may include any suitable etch mask material that can sustain a polishing process. The etch mask material is a fluid when coating on the stack structure. After finishing coating, the etch mask material becomes a solid through a process treatment. In a subsequent anisotropic etching process, an etch rate on dielectric material layer 310 may be higher than an etch rate on etch mask layer 304. In some embodiments, a ratio of the etch rate on the dielectric material layer over the etch rate on the etch mask layer ranges from about 20:1 to about 100:1. Etch mask layer 304 may include photoresist, resin, polymer, and/or other suitable materials that can form an even (e.g., a flat) surface over stack structure 306. In some embodiments, etch mask layer 304 includes a photoresist layer and is coated on stack structure 306 through a spin coating process.

Method 500 proceeds to operation 506, in which a polishing process is performed on the etch mask layer to fully remove a portion of the etch mask layer in the array region and partially remove a portion of the etch mask layer in the staircase region. FIG. 3B illustrates a corresponding structure.

As shown in FIG. 3B, a polishing process may be performed on etch mask layer 304 to fully remove a portion of etch mask layer 304 in the array region. The polishing process may stop until the portion of etch mask layer 304 on the array region is fully removed, and dielectric material layer 310 is exposed. In some embodiments, if an etch stop layer is formed between dielectric material layer 310 and etch mask layer 304, the polishing process stops on the etch stop layer in the array region. The polishing process may also partially remove the portion of etch mask layer 304 in the staircase region. After the polishing process, an etch mask portion 314, e.g., a remaining portion of etch mask layer 304 in the staircase region, may be retained in the staircase region, e.g., over the staircase structure. The thickness of etch mask portion 314 may increase gradually along the x-direction away from the array region. In some embodiments, the polishing process includes a CMP process.

Method 500 proceeds to operation 508, in which an anisotropic etching process is performed to etch the dielectric material layer in the array region and the etch mask portion in the staircase region. FIG. 3B illustrates a corresponding structure.

As shown in FIG. 3B, an anisotropic etching process may be performed to etch the exposed portion of dielectric material layer 310 and etch mask portion 314. In some embodiments, the etch stop layer, if any, is etched away. The etching process may be controlled until a desired thickness of dielectric material layer 310 in the array region is reached. In some embodiments, the anisotropic etching process includes a dry etch. The anisotropic etching process may reduce a thickness of etch mask portion 314 in the z-direction or fully remove etch mask portion 314. In various embodiments, the exposed portion of dielectric material layer 310 and etch mask portion 314 can be etched in a same etching process or in different etching processes.

Because the etch rate on dielectric material layer 310 is higher than the etch rate on etch mask portion 314, dielectric material layer 310 is consumed faster than etch mask portion 314. Also, the portion of dielectric material layer 310 covered with thinner etch mask material may start to be etched sooner than the portion of dielectric material layer 310 covered with thicker etch mask material, and thus undergo more etching. As a result, a portion of dielectric material layer 310 closer to the array region may undergo more etching than that farther away from the array region. This difference in etch rates can reduce or eliminate the formation of steps in dielectric material layer 310. In some embodiments, the etching selectivity (e.g., etch rates on the dielectric material and the etch mask material) can be chosen/varied to obtain a desirable etching profile, thus minimizing the potential step height. FIG. 3D illustrates a cross-sectional view of the 3D memory device shown in FIG. 3B along the A-A' direction. For ease of illustration, etch mask portion 314 is not shown in FIG. 3D. Step height H1 of dielectric material layer 310 may be smaller than step height H0, given that dielectric material layer 310 of the same thickness is deposited over the respective stack structure. In some embodiments, compared to step height H0, step height H1 can be reduced by about 80%, given that dielectric material layer 310 of the same thickness is deposited over the respective stack structure. The reduced step height can effectively reduce the time in the subsequent polishing process. In some embodiments, the total fabrication time, using the disclosed method, can be reduced by at least 80%.

Method 500 proceeds to operation 510, in which the etch mask portion is removed. FIG. 3C illustrates a corresponding structure.

As shown in FIG. 3C, any etch mask portion 314 in the staircase region may be fully removed after the etching process of operation 508 is completed. In some embodiments, etch mask portion 314 includes a photoresist portion, and the removal includes an ashing process, e.g., oxygen plasma cleaning process.

Method 500 proceeds to operation 512, in which another polishing process is performed to planarize the remaining dielectric material layer. FIG. 3C illustrates a corresponding structure.

As shown in FIG. 3C, another polishing process may be performed to planarize the remaining dielectric material layer, after the etching process of operation 508. A dielectric layer 320 may be formed, after the polishing process, in the staircase structure and the array region. The polishing process may remove any excess dielectric material in the array region and the staircase region until a dielectric layer 320, having a desired thickness in the array region and the staircase region, is formed. The step height of dielectric layer 320 may be minimized or eliminated. The time of the polishing process and the overall fabrication process can be effectively reduced. In some embodiments, the polishing process includes a CMP process. The structure, along the A-A' direction, after the other polishing process, e.g., after the portion of dielectric material layer 310 in the array region is removed in operation 512, is shown in FIG. 4.

FIG. 4 illustrates a cross-sectional view of a 3D memory device 400 formed by the method of the present disclosure, according to some implementations. 3D memory device 400 may be formed after or by operation 512. 3D memory device 400 can include an array region 401 and a staircase region 403 laterally neighboring array region 401. Stack structure 306 may include interleaved a plurality of conductive layers 404 and a plurality of dielectric layers 406 arranged in the z-direction. 3D memory device 400 may include, in array region 401, a NAND memory string 413 and a source contact structure 416. In staircase region 403, 3D memory device 400 may include a staircase structure 408 having a plurality of stairs. Dielectric layer 320 may be formed over stack structure 306 in staircase region 403 (e.g., over staircase structure 408) and array region 401. In various embodiments, the formation of conductive layers 404, NAND memory string 413, and source contact structure 416 may be prior to, at the same time with, or after the formation of dielectric layer 320, and should not be limited by the implementations of the present disclosure.

NAND memory string 413 can extend vertically through stack structure 306 into substrate 302. In some implementations, NAND memory string 413 are formed extending vertically in stack structure 306. In some implementations, in which the second material layers include dielectric layers, such as silicon nitride, a gate replacement process is performed to replace the second material layers with conductive layers 404 including conductive materials, such as W. For example, a slit may be etched through stack structure 306 using wet etching and/or dry etching, such as DRIE, which may serve as the passageways for the gate replacement process. The replacement of the second material layers with the conductive material can be performed by wet etching the second material layers (e.g., silicon nitride) selective to the first material layers (e.g., silicon oxide) and filling the resulting lateral recesses with the conductive material (e.g., W). The conductive material can be deposited using one or more thin film deposition processes including, but not limited to ALD, CVD, PVD, or any combination thereof.

Source contact structure 416 can be formed by sequentially depositing one or more dielectric layers (e.g., silicon oxide, as a spacer) and one or more conductive layers (e.g., W and polysilicon, as a contact) into the slit using one or more thin film deposition processes including, but not limited to ALD, CVD, PVD, or any combination thereof.

Implements of the present disclosure provide a method for forming a 3D memory device. The method includes forming a stack structure over a staircase region and an array region, forming a dielectric material layer over the array region and the staircase region, coating an etch mask layer over the dielectric material layer, planarizing the etch mask layer on a first surface away from the dielectric material layer, and etching the dielectric material layer and a remaining portion of the etch mask layer to form a dielectric layer over the staircase region and the array region.

In some implementations, the first surface of the etch mask layer is level.

In some implementations, the etch mask layer includes photoresist.

In some implementations, planarizing the etch mask layer includes performing a CMP on the etch mask layer until a portion of the dielectric material layer over the array region is exposed.

In some implementations, the method further includes etching the remaining portion of the etch mask layer in the staircase region in a same etching process that etches the dielectric material layer.

In some implementations, an etch rate on the dielectric material layer is higher than an etch rate on the etch mask layer.

In some implementations, a ratio of the etch rate on the dielectric material layer over the etch rate on the etch mask layer ranges from about 20:1 to about 100:1.

In some implementations, etching the dielectric material layer and the remaining portion of the etch mask layer includes a dry etching process.

In some implementations, the method further includes fully removing the remaining portion of the etch mask layer in the staircase region after the etching of the dielectric material layer.

In some implementations, removing the remaining portion of the etch mask layer includes an ashing process.

In some implementations, the method further includes planarizing the dielectric layer over the array region and the staircase region.

In some implementations, forming the etch mask layer includes a spin coating process.

In some implementations, forming the stack structure includes forming a plurality of interleaved first material layers and second material layers. Edges of the interleaved first material layers and second material layers define a staircase structure on a side of the stack structure in the staircase region. The dielectric material layer is over the staircase structure.

Implementations of the present disclosure provide a method for forming a 3D memory device. The method includes forming a stack structure over a staircase region and an array region, forming a dielectric material layer over the array region and the staircase region, forming an etch mask portion over a portion of the dielectric material layer over the staircase region, and etching the dielectric material layer and the etch mask portion to form a dielectric layer over the staircase region and the array region.

In some implementations, the etch mask portion includes a photoresist portion.

In some implementations, forming the etch mask portion includes coating an etch mask layer on the dielectric material layer over the staircase region and the array region. In some implementations, planarizing the etch mask layer to fully remove a portion of the etch mask layer over the array region.

In some implementations, planarizing the etch mask layer includes performing a CMP on the etch mask layer until the portion of the dielectric material layer over the array region is exposed.

In some implementations, the etch mask portion and the dielectric material layer are etched in a same etching process.

In some implementations, an etch rate on the dielectric material layer is higher than an etch rate on the etch mask portion.

In some implementations, a ratio of the etch rate on the dielectric material layer over the etch rate on the etch mask portion ranges from about 20:1 to about 100:1.

In some implementations, etching the dielectric material layer and the etch mask portion includes a dry etching process.

In some implementations, removing the etch mask portion includes an ashing process.

In some implementations, the method further includes planarizing the dielectric layer over the array region and the staircase region.

In some implementations, forming the etch mask layer includes a spin coating process.

In some implementations, forming the stack structure includes forming a plurality of interleaved first material layers and second material layers. Edges of the interleaved first material layers and second material layers define a staircase structure on a side of the stack structure in the staircase region. The dielectric material layer is over the staircase structure.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A method for forming a three-dimensional (3D) memory device, comprising:
    forming a stack structure over a staircase region and an array region;
    forming a dielectric material layer over the array region and the staircase region;

forming an etch mask layer over the dielectric material layer;

planarizing a first surface of the etch mask layer away from the dielectric material layer to fully remove a portion of the etch mask layer over the array region and form a remaining portion of the etch mask layer over the staircase region; and etching the dielectric material layer and the remaining portion of the etch mask layer to form a dielectric layer over the staircase region and the array region.

2. The method of claim 1, wherein the first surface of the etch mask layer is level.

3. The method of claim 1, wherein the etch mask layer comprises photoresist.

4. The method of claim 1, wherein planarizing the etch mask layer comprises performing a chemical mechanical polishing (CMP) on the etch mask layer until a portion of the dielectric material layer over the array region is exposed.

5. The method of claim 4, further comprising etching the remaining portion of the etch mask layer in the staircase region in a same etching process that etches the dielectric material layer.

6. The method of claim 1, wherein an etch rate on the dielectric material layer is higher than an etch rate on the etch mask layer.

7. The method of claim 6, wherein a ratio of the etch rate on the dielectric material layer over the etch rate on the etch mask layer ranges from about 20:1 to about 100:1.

8. The method of claim 1, wherein etching the dielectric material layer and the remaining portion of the etch mask layer comprises a dry etching process.

9. The method of claim 1, further comprising fully removing the remaining portion of the etch mask layer over the staircase region after the etching of the dielectric material layer.

10. The method of claim 9, wherein removing the remaining portion of the etch mask layer comprises an ashing process.

11. The method of claim 1, further comprising planarizing the dielectric layer over the array region and the staircase region.

12. The method of claim 1, wherein forming the etch mask layer comprises a spin coating process.

13. A method for forming a three-dimensional (3D) memory device, comprising:

forming a stack structure over a staircase region and an array region;

forming a dielectric material layer over the array region and the staircase region;

forming an etch mask layer over the dielectric material layer that is arranged over the array region and the staircase region, the etch mask layer comprising a first portion over the array region and a second portion over the staircase region, and the second portion of the etch mask layer being thicker than the first portion of the etch mask layer;

removing the first portion of the etch mask layer, over the array region, from the etch mask layer to form an etch mask portion over a portion of the dielectric material layer over the staircase region, the etch mask portion being part of the second portion of the etch mask layer over the staircase region; and etching the dielectric material layer and the etch mask portion to form a dielectric layer over the staircase region and the array region.

14. The method of claim 13, wherein the etch mask portion comprises a photoresist portion.

15. The method of claim 13, wherein:

removing the first portion of the etch mask layer, over the array region, from the etch mask layer to form the etch mask portion over the staircase region comprises planarizing the etch mask layer to fully remove the first portion of the etch mask layer over the array region.

16. The method of claim 15, wherein planarizing the etch mask layer comprises performing a chemical mechanical polishing (CMP) on the etch mask layer until another portion of the dielectric material layer over the array region is exposed.

17. The method of claim 13, wherein the etch mask portion and the dielectric material layer are etched in a same etching process.

18. The method of claim 13, wherein an etch rate on the dielectric material layer is higher than an etch rate on the etch mask portion.

19. The method of claim 18, wherein a ratio of the etch rate on the dielectric material layer over the etch rate on the etch mask portion ranges from about 20:1 to about 100:1.

20. The method of claim 13, wherein etching the dielectric material layer and the etch mask portion comprises a dry etching process.

\* \* \* \* \*